United States Patent
Lai

(10) Patent No.: US 7,362,998 B2
(45) Date of Patent: Apr. 22, 2008

(54) MOBILE MILITARY SATELLITE RECEIVER ARCHITECTURE FOR ACCOMMODATING WIDE CARRIER OFFSET AND METHOD OF PERFORMING COARSE CARRIER OFFSET ADJUSTMENT

(75) Inventor: Yhean-Sen Lai, Warren, NJ (US)

(73) Assignee: Infineon Technologies AG, Munich (DE)

( * ) Notice: Subject to any disclaimer, the term of this patent is extended or adjusted under 35 U.S.C. 154(b) by 763 days.

(21) Appl. No.: 10/821,486

(22) Filed: Apr. 9, 2004

(65) Prior Publication Data

US 2005/0239398 A1   Oct. 27, 2005

(51) Int. Cl.
*H04H 1/00* (2006.01)
(52) U.S. Cl. ............... 455/3.02; 455/12.1; 455/427
(58) Field of Classification Search ........... 455/3.02, 455/12.1, 562.1, 13.3, 142, 313, 324, 323; 370/347, 389; 375/326, 344
See application file for complete search history.

(56) References Cited

U.S. PATENT DOCUMENTS

| | | | |
|---|---|---|---|
| 6,697,439 B1 * | 2/2004 | Trivedi et al. ............. | 375/326 |
| 6,985,093 B2 * | 1/2006 | Jaffe et al. .................. | 341/50 |
| 7,139,340 B2 * | 11/2006 | Scarpa ......................... | 375/344 |
| 7,180,892 B1 * | 2/2007 | Tackin ......................... | 370/389 |
| 2005/0079838 A1 * | 4/2005 | Li et al. ...................... | 455/142 |
| 2005/0079850 A1 * | 4/2005 | Chen et al. .................. | 455/324 |
| 2005/0174983 A1 * | 8/2005 | Naguleswaran et al. .... | 370/347 |

OTHER PUBLICATIONS

Agere Systems/Sirius Satellite Radio-Proprietary—"Sirius Satellite Radio Satellite Digital Audio Radio Service (SDARS) System Architecture Document and Receiver Functional Specification," Rev. 1.3, May 1, 2002.

* cited by examiner

*Primary Examiner*—Tan Trinh

(57) ABSTRACT

A coarse carrier offset adapter for determining a coarse carrier offset for application to a received satellite signal, a method of performing coarse carrier offset adjustment and a time division multiplexing (TDM) satellite receiver. In one embodiment, the adapter includes: (1) an energy estimator configured to analyze, with respect to the received satellite signal, energies in bands on either side of a baseband as displaced by a coarse carrier offset and (2) an offset adapter coupled to the energy estimator and configured to change the coarse carrier offset until the energies become substantially equal and provide the coarse carrier offset to a digital down converter for the application.

13 Claims, 10 Drawing Sheets

MOBILE MILITARY SATELLITE RECEIVER ARCHITECTURE FOR ACCOMMODATING WIDE CARRIER OFFSET AND METHOD OF PERFORMING COARSE CARRIER OFFSET ADJUSTMENT

TECHNICAL FIELD OF THE INVENTION

The present invention is directed, in general, to satellite communications and, more specifically, to a mobile military satellite receiver architecture for accommodating wide carrier offset and a method of performing coarse carrier offset adjustment.

BACKGROUND OF THE INVENTION

Military satellites have become indispensable tools in today's more challenging security environment. A major effort is underway to increase the timeliness and relevance of the photographic and signals intelligence that military satellites have to offer by making it available to field commanders and front-line troops. The large ground stations that are now required for satellite uplink and downlink therefore must evolve into rugged and mobile satellite receivers for soldiers and their vehicles.

Military satellites use time division multiplexing (TDM) to communicate. Satellite Digital Audio Radio Service (SDARS) systems also use TDM (see, Sirius Satellite Radio, "Satellite Digital Audio Radio Service (SDARS) System Architecture Document and Receiver Functional Specification," Rev 1.3, May 01, 2002, incorporated herein by reference). Military satellites use differential quadrature phase shift keying (DQPSK). (DQPSK ensures that their transmitted signals are of constant power.) SDARS also uses DQPSK. Existing SDARS satellite receiver architectures and circuitry would therefore appear to be readily adaptable for use in a mobile military satellite receiver.

Unfortunately, this is not the case. As satellites orbit relative to their Earthbound receivers, the well-known Doppler shift causes their carrier frequencies to be offset. SDARS satellite receivers are designed to accommodate only a 78 kHz carrier offset. This is adequate for SDARS broadcasts, because SDARS satellites have high, generally circular orbits, meaning that the Doppler shift is relatively small. In contrast, some military satellites have low, highly elliptical orbits. This means that the carrier offset between the satellite and mobile receiver can be as much as 1.4 MHz. Conventional SDARS satellite receiver architectures and circuitry cannot accommodate this far greater offset.

Accordingly, what is needed in the art is an architecture appropriate for mobile military satellite receivers and a method of receiving military satellite transmissions. What is further needed in the art is a way to adapt existing SDARS satellite receiver architectures and circuitry to a military satellite communications environment.

SUMMARY OF THE INVENTION

To address the above-discussed deficiencies of the prior art, the present invention introduces a coarse carrier offset adapter (CCOA) into the SDARS architecture and method. The CCOA provides a coarse adjustment that accommodates the higher carrier offset encountered in military satellite communications.

In one aspect, the present invention provides a CCOA for determining a coarse carrier offset for application to a received satellite signal. In one embodiment, the adapter includes: (1) an energy estimator configured to analyze, with respect to the received satellite signal, energies in bands on either side of a baseband as displaced by a coarse carrier offset and (2) an offset adapter coupled to the energy estimator and configured to change the coarse carrier offset until the energies become substantially equal and provide the coarse carrier offset to a digital down converter for the application.

In another aspect, the present invention provides a method of performing coarse carrier offset adjustment for application to a received satellite signal. In one embodiment, the method includes: (1) analyzing, with respect to the received satellite signal, energies in bands on either side of a baseband as displaced by a coarse carrier offset, (2) changing the coarse carrier offset until the energies become substantially equal and (3) providing the coarse carrier offset to a digital down converter for the application.

In yet another aspect, the present invention provides a TDM satellite receiver. In one embodiment, the satellite receiver includes: (1) a TDM antenna adapted to receive a quadrature modulated satellite signal, (2) an antenna radio frequency (RF) processor coupled to the TDM antenna, (3) an RF/intermediate frequency (RF/IF) processor coupled to the antenna radio frequency processor, (4) an analog to digital converter (ADC) coupled to the RF/IF processor, (5) first and second TDM demodulators and (6) a digital down converter, interposing the ADC and the first and second TDM demodulators and having a CCOA for determining a coarse carrier offset for application to the satellite signal that has: (6a) an energy estimator configured to analyze, with respect to the satellite signal, energies in bands on either side of a baseband as displaced by a coarse carrier offset and (6b) an offset adapter coupled to the energy estimator and configured to change the coarse carrier offset until the energies become substantially equal and provide the coarse carrier offset to the digital down converter for the application.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
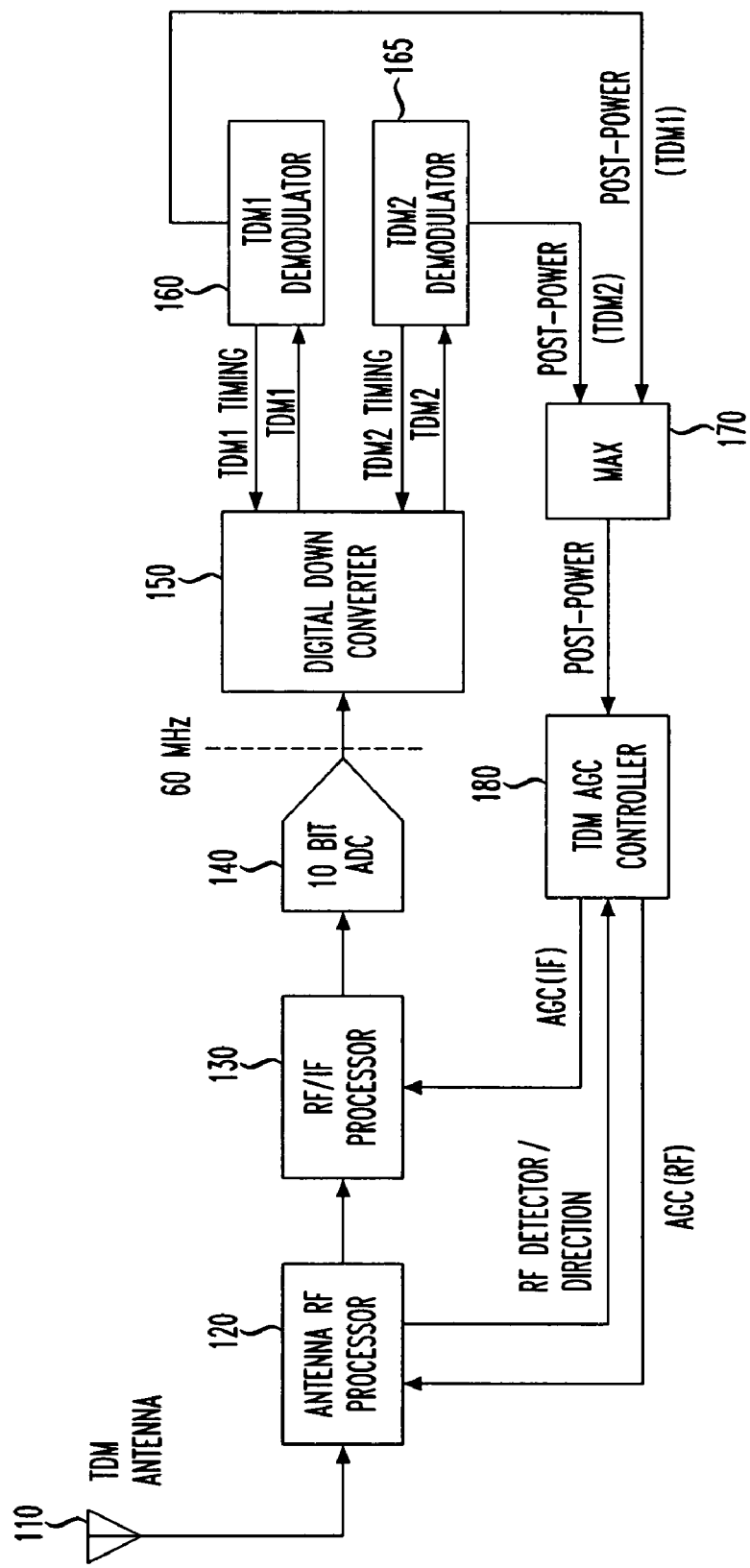
FIG. 1 illustrates a block diagram of one embodiment of a TDM satellite receiver that incorporates a coarse carrier offset adapter (CCOA) constructed according to the principles of the present invention to rendering the satellite receiver suitable for performing coarse carrier offset adaptation.

Referring initially to FIG. 1, illustrated is a block diagram of a TDM satellite receiver that incorporates a coarse carrier offset adapter (CCOA) constructed according to the principles of the present invention.

Radio frequency (RF) processing begins at the output of an antenna element 110 that picks up the TDM signal. The antenna 110 provides the signal to an RF processor 120 that includes a low noise amplifier (LNA) (not shown) and an RF filter (not shown). The amplified and filtered signal is provided to an RF/intermediate frequency (RF/IF) processor 130.

The RF/IF processor 130 first applies a 2326.25 MHz carrier to downconvert the RF signal into a 315 MHz first IF signal. Then, the gain of the first IF signal is adjusted in the RF/IF processing block 130. Next, the RF/IF processor 130 again downconverts the first IF signal, resulting in a 240 MHz second IF signal. Finally, the RF/IF processor 130 filters and downconverts the second IF signal once again to a 75 MHz IF output signal.

An analog-to-digital converter (ADC) 140 converts the IF output signal to a data stream with 10-bit resolution and 60 MHz clock sampling. At this point, a digital down converter (DDC) 150 performs further downconversion in the digital domain. Because the illustrated embodiment of the CCOA of the present invention is advantageously located in the DDC 150, the DDC 150 will now be described in greater detail with reference to FIG. 2.

Figure 2:
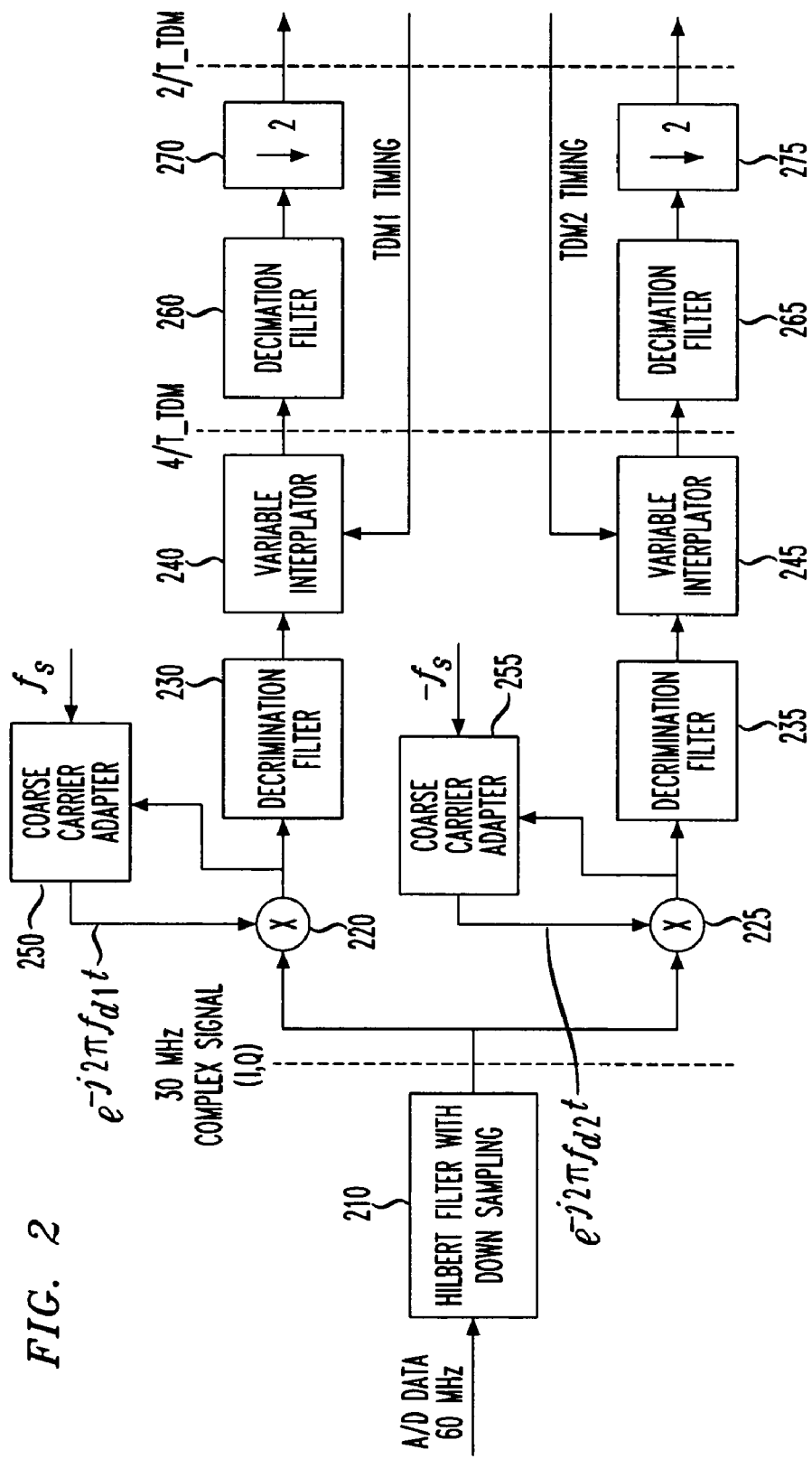
FIG. 2 illustrates a block diagram of one embodiment of a digital downconverter (DDC) contained within the TDM satellite receiver of FIG. 1 that incorporates a CCOA constructed according to the principles of the present invention.

Turning now to FIG. 2, illustrated is the DDC 150 of FIG. 1. The DDC 150 converts the data stream into two baseband TDM signals at a 2/T_TDM sampling rate, where T_TDM=266.0706 ns. A Hilbert filter 210 with downsampling creates a 30 MHz complex signal with in-phase (I) and quadrature (Q) components. A subband extractor (not shown) uses mixers 220, 225 to shift the two TDM signals into baseband signals. Decimation filters 230, 235, 260, 265, variable interpolators 240, 245 and decimators 270, 275 further downsample the complex baseband signals into a 2/T_TDM sampling rate.

To accommodate TDM demodulation in the wide carrier offset environment of military satellite communications, a CCOA 250, 255 (one for I and one for Q) constructed according to the principles of the present invention is added in the DDC 150. The CCOA 250, 255 constrains the wide carrier offset into a narrow carrier offset, for example less than about 78 kHz. Thereafter, the DDC 150 and TDM demodulators (to be described below) can operate in a normal way without degrading overall performance. The CCOA 250, 255 is combined with the carrier frequency of TDM1 and TDM2 (also to be described below) in the mixers 220, 225, respectively. This converts the passband signal into a baseband signal with a relatively narrow carrier offset. The carrier frequencies of TDM1 and TDM2, after processing by the Hilbert filter 210 with downsampling, are $f_s$ and $-f_s$ respectively.

Figure 3:
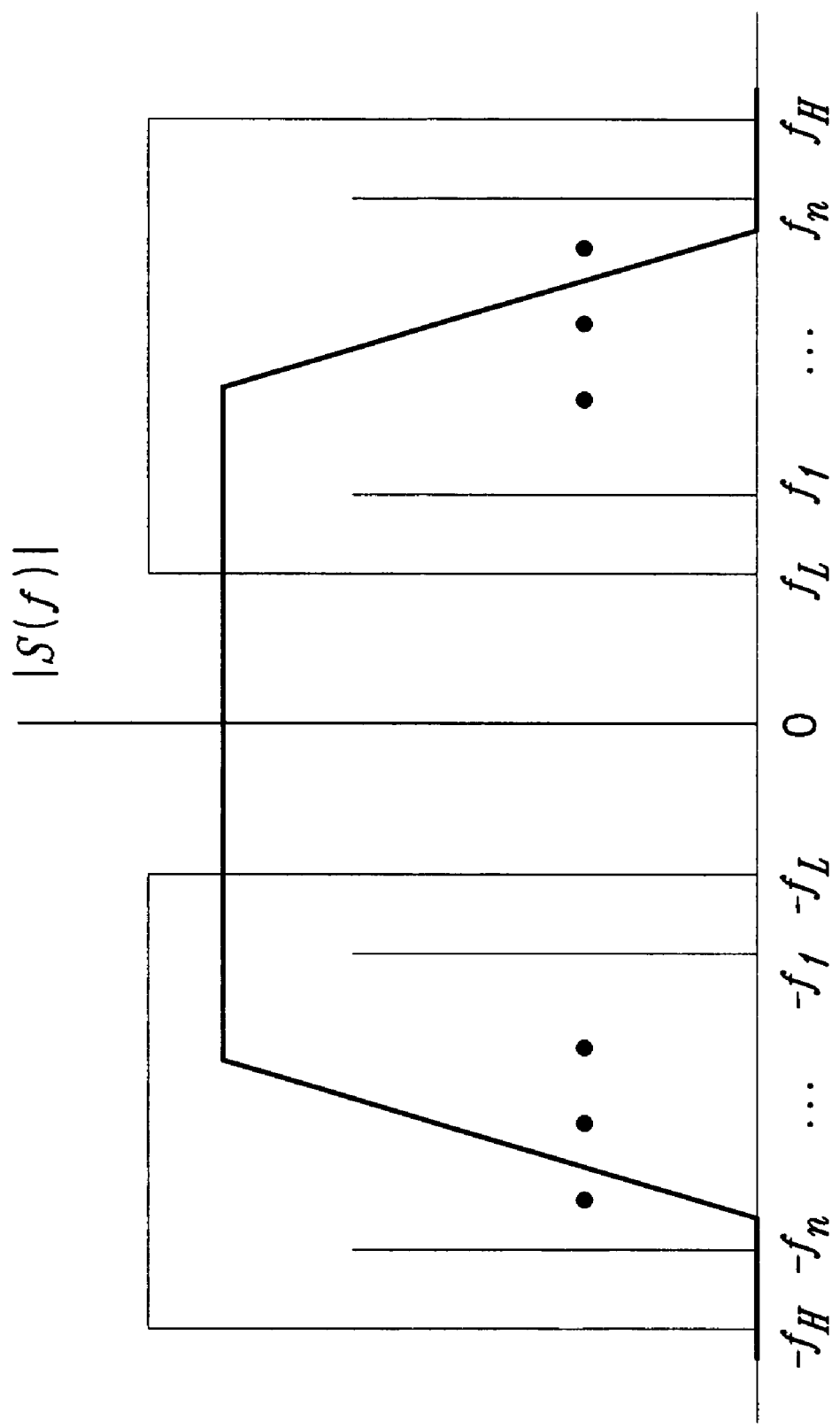
FIG. 3 illustrates a graph of a baseband signal having a frequency response of $|S(f)|$.

To illustrate the operation of the CCOA 250, 255, consider a baseband signal with the frequency response |S(f)| shown in FIG. 3. If the frequency response |S(f)| is symmetric relative to the original point (0) without carrier offset, the energy that appears between $f_L$ and $f_H$ is the same as that between $-f_L$ and $-f_H$. On the other hand, if a carrier offset $f_c$ is applied to the baseband signal, the whole frequency response of the signal is shifted to the right by $f_c$, and the energy that appears between $f_L$ and $f_H$ is higher than that appearing between $-f_L$ and $-f_H$, shown in FIG. 4. The illustrated embodiment of the CCOA (250, 255 of FIG. 2) employs the known least means square (LMS) algorithm to find the coarse carrier offset $f_c$, such that the energies appearing in the ($f_L$ $f_H$) and ($-f_L$ $-f_H$) bands are the same. The illustrated embodiment of the CCOA (250, 255 of FIG. 2) uses the Goertzel algorithm to estimate the energies that appears in these two bands, although other energy estimation algorithms are within the scope of the present invention.

Turning back briefly to FIG. 1, it is apparent that the two TDM signals are provided to first and second TDM demodulators 160, 165, which respectively generate TDM1 and TDM2. A post-power feedback loop including a maximum detector 170 and a TDM AGC controller 180 will not be described, because they are conventional. However, the structure of the first demodulator 160 and the second demodulator 165 will be described in greater detail with reference to FIG. 5.

Figure 5:
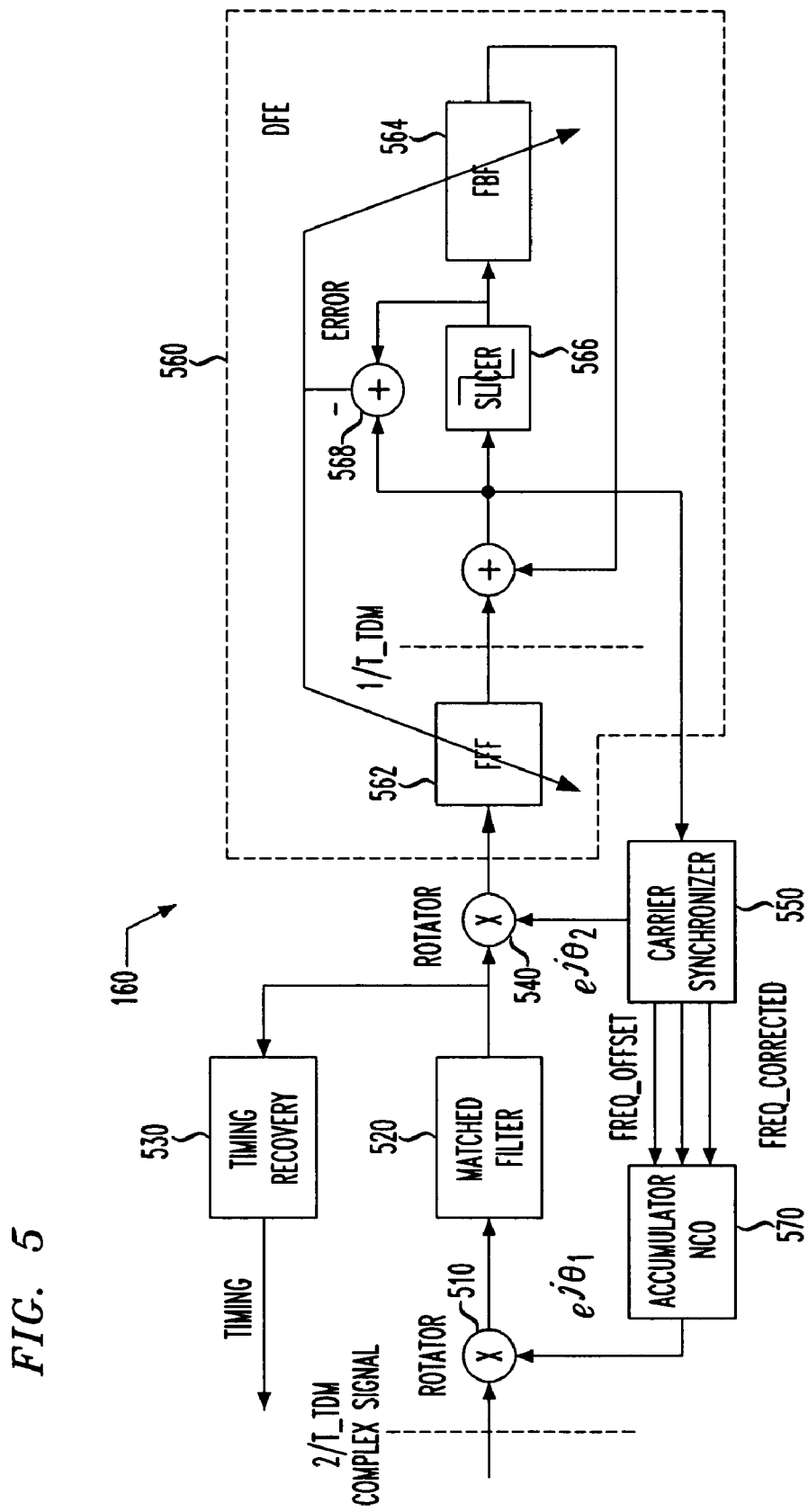
FIG. 5 illustrates a block diagram of one embodiment of a TDM demodulator contained within the TDM satellite receiver of FIG. 1 that incorporates a CCOA constructed according to the principles of the present invention.

Turning now to FIG. 5, illustrated is a block diagram of one embodiment of the first TDM demodulator 160. In the illustrated embodiment, the second TDM demodulator 165 is identical to the first TDM demodulator 160, so only the first TDM demodulator 160 will be described.

A rotator 510 receives TDM 1 from the DDC 150 of FIG. 1. The output of the rotator 510 is provided to a matched filter 520, which provides its output signal to a timing recovery circuit 530. The timing recovery circuit 530 extracts a timing signal, which is returned to the DDC 150 of FIG. 1. In the illustrated embodiment, the timing recovery circuit 530 employs a Gardner timing error detector to extract the timing signal (see, Gardner, "A BPSK/QPSK Timing-Error Detector for Sampled Receivers," IEEE Transactions on Communications, pp. 423-429, Vol. Com-34, No. 5, May 1986, incorporated herein by reference).

The matched filter 520 further provides its output signal to a rotator 540 with the correct phase from a carrier synchronizer 550. The rotated output signal then enters into a decision feedback equalizer (DFE) 560. Carrier synchronization is achieved by a digital phase-locked loop (PLL) operating on a phase error provided by the DFE 560. The DFE includes a feedforward filter (FFF) 562, a feedback filter (FBF) 564, a slicer 566 and an error computation circuit 568.

The carrier synchronizer 550 produces two output signals: freq_offset and freq_corrected. Freq_offset is the initial value of the carrier offset estimated in acquisition time. Freq_corrected is used to adjust the carrier offsets that appear before and after the matched filter 520 during steady state operation of the satellite receiver. An accumulator numerically controlled oscillator (NCO) 570 drives the rotator 510 using freq_offset and freq_corrected provided by the carrier synchronizer 550.

Figure 6:
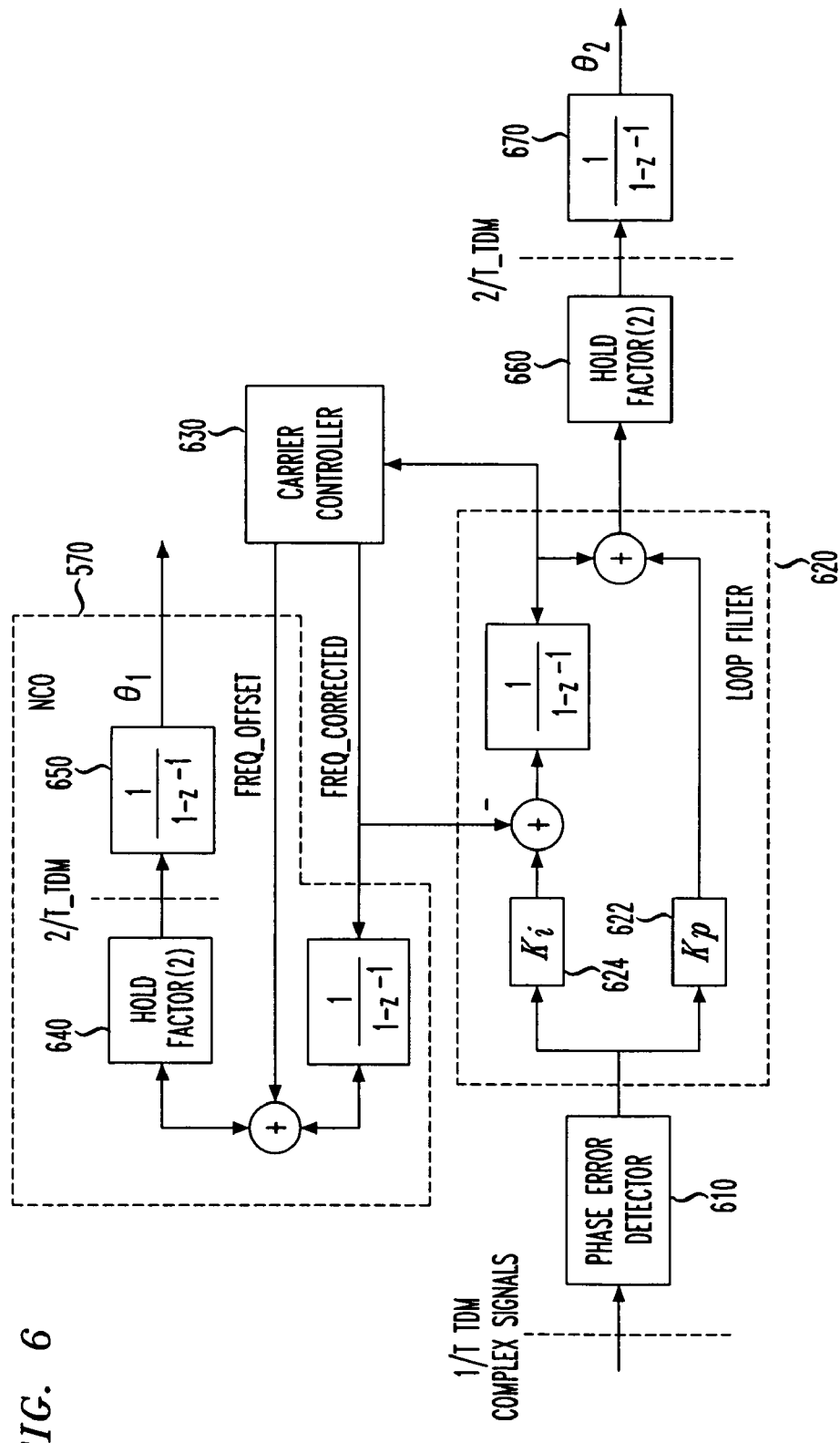
FIG. 6 illustrates a block diagram of one embodiment of a carrier synchronizer contained within the TDM modulator of FIG. 5.

Turning now to FIG. 6, illustrated is a more detailed block diagram of the carrier synchronizer 550 and the accumulator NCO 570 of FIG. 5. The carrier synchronizer 550 includes a phase error detector (PED) 610, a loop filter 620 and a carrier controller 630 that cooperate to generate freq_offset and freq_corrected for the NCO 570.

The PED 610 generates an error signal that depends upon the output of the DFE 560, which, in turn, depends on the phase error of the samples processed within the DFE 560. The PED 610 is of the decision directed maximum likelihood (DDML) type. The graph of the output of the PED 610 over the phase error takes the form of an S-curve. The slope of the S-curve for zero phase error (see, Gardner, supra) is the PED gain $K_{PED}$ and is typically a function of signal to noise ratio (Es/No).

Let the X-Y coordinate of input point be (real_in imag_in) which is the output of the equalizer. Since the ideal reference point is located at (sign(real_in) sign(imag_in)), PED is given as:

$$PED = \text{sign}(\text{real\_in})*\text{imag\_in} - \text{sign}(\text{imag\_in})*\text{real\_in} \quad (1)$$

The loop filter 620 is embodied in a $2^{nd}$ order infinite impulse response (IIR) filter having a transfer function H(z) of:

$$H(z) = \frac{K_p + K_i - K_p z^{-1}}{1 - z^{-1}} \quad (3)$$

where $K_p$ 622 and $K_i$ 624 are the gains of the IIR filter. A "hold factor (2)" block 640 converts the sampling clock from 1/T_TDM to 2/T_TDM. A transfer function 650 of $1/(1-z^{-1})$ then follows, resulting in $\theta_1$, which is provided to the rotator 510.

The loop filter 620 further provides a signal to a second "hold factor (2)" block 660, which converts the sampling clock from 1/T_TDM to 2/T_TDM. A second transfer function 670 of $1/(1-z^{-1})$ then follows, resulting in $\theta_2$, which is provided to the rotator 540.

Figure 7:
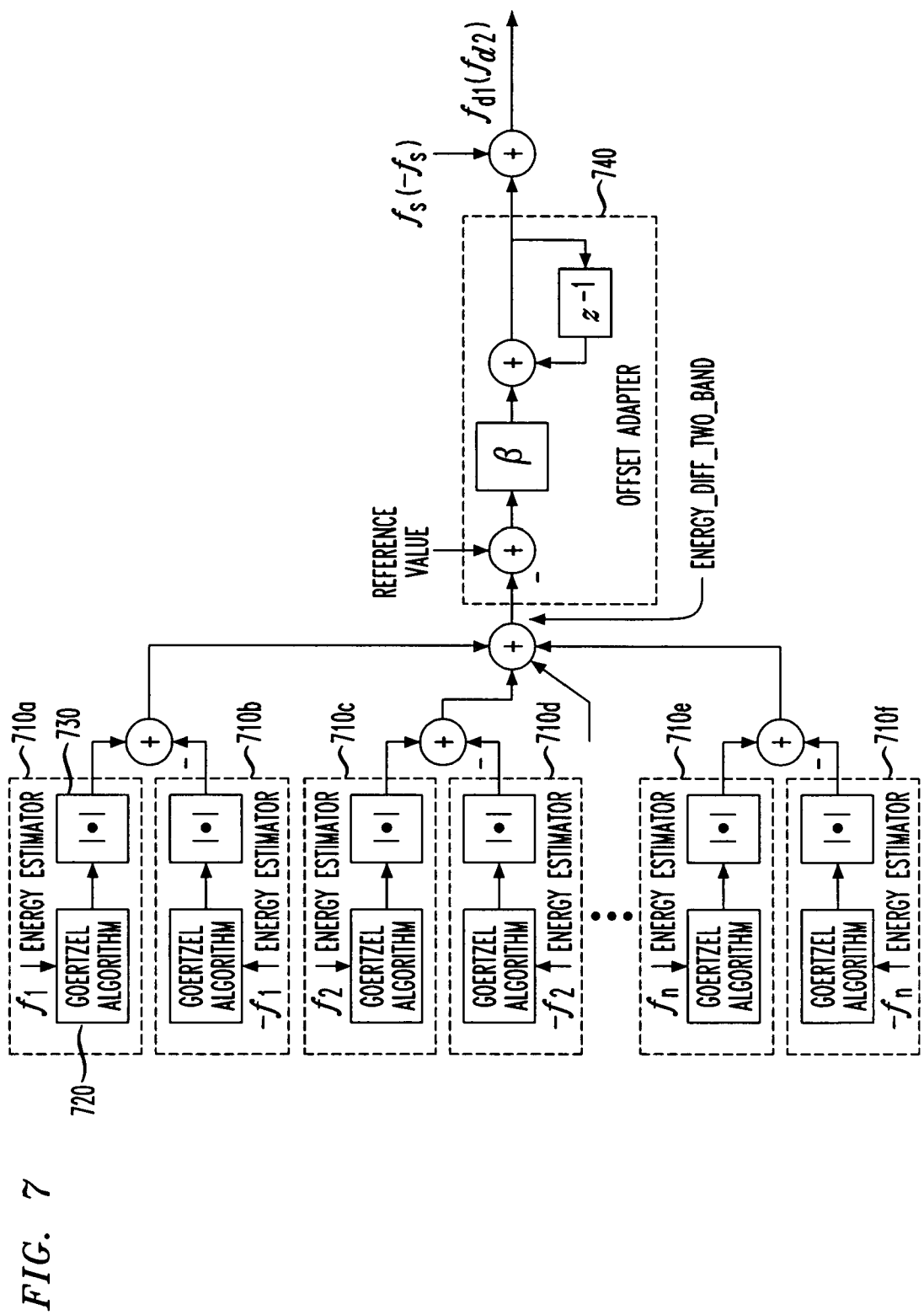
FIG. 7 illustrates a block diagram of one embodiment of a CCOA constructed according to the principles of the present invention.

Turning now to FIG. 7, illustrated is a block diagram of one embodiment of a CCOA (250, 255 of FIG. 2) constructed according to the principles of the present invention. In the illustrated embodiment, the CCOA 255 is identical to the CCOA 250, so only the CCOA 250 will be described.

If the received satellite signal is asymmetric, a constant energy difference will exist between its two sidebands. This constant energy difference is called the "reference value" (reference_value in FIG. 7). The CCOA 250 bases its operation on this fact and accordingly includes a plurality of energy estimators (six of which are shown in the embodiment of FIG. 7 and are referenced 710a, 710b, 710c, 710c, 710d, 710e, 710f).

Each energy estimator (e.g., 710a) includes two parts 720, 730. The first part 720 calculates the frequency response of a given frequency $f_n$ by the Goertzel algorithm. The second part 730 takes the absolute value of the complex output from the first part 720.

Consider a complex input signal x(m). The Goertzel algorithm computes the $k^{th}$ DFT (Discrete Fourier Transform) coefficient by using a second-order filter having a transfer function of:

$$s_k(m) = x(m) + 2\cos\left(\frac{2\pi k}{N}\right)s_k(m-1) - s_k(m-2) \quad (4)$$

$$y_k(m) = s_k(m) - W_N^k s_k(m-1) \quad (5)$$

where $$s_k(-2) = s_k(-1) = 0 \quad \text{and} \quad W_N^k = e^{j\frac{2\pi k}{N}}.$$

Figure 4:
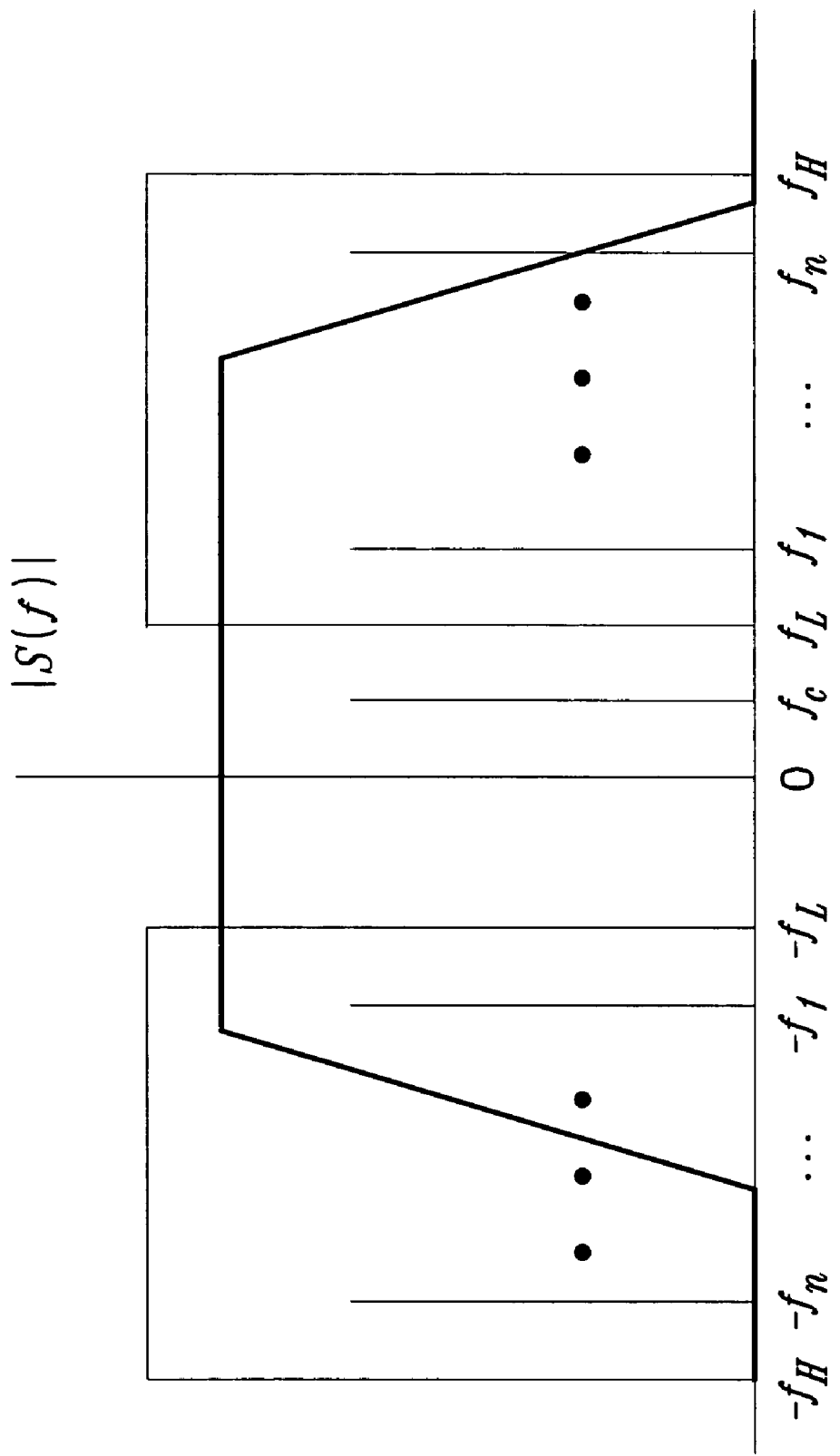
FIG. 4 illustrates a graph of the baseband signal of FIG. 3 to which a carrier offset $f_c$ is applied.

The $k^{th}$ discrete Fourier transform (DFT) coefficient is produced after the filter has processed N samples or $y_k(m)|_{m=N}$. The value of N should be large enough for good frequency resolution. For example, if the Nyquist bandwidth of the complex baseband signal (including the possible carrier offset) is BW, the frequency separation of the energy estimators is BW/N. The total energy in each band in FIGS. 3 and 4 is estimated by n energy estimators, whose frequencies are located at $f_1, f_2, \ldots, f_n$ and $-f_1, -f_2, \ldots, -f_n$ respectively. The total energy in each band is summation of its own n energy estimators.

The subtracter computes the energy difference that appears at $f_1, f_2, \ldots, f_n$ and $-f_1, -f_2, \ldots, -f_n$ at every N samples, and then these energy differences are summed up. The result, called energy_diff_two_band in FIG. 7, denotes the total energy difference that appears in the ($f_L$ $f_H$) and ($-f_L$ $-f_H$) bands.

An adapter 740 is used to adjust the carrier offset $f_c$ such that energy_diff_two_band is matched to reference_value:

$$\text{energy\_error}(t) = \text{reference\_value} - \text{energy\_diff\_two\_band}(t) \\ f_c(t) = f_c(t-1) + \beta \text{energy\_error}(t) \quad (6)$$

where $\beta$ is the updating coefficient.

Reference_value is set according to the characteristic of the transmitted signal. If the frequency response of the transmitted signal is symmetric, reference_value is set to zero, otherwise a constant offset is set in corresponding to the asymmetry of the transmitted signal that causes the unequal energies in the ($f_L$ $f_H$) and ($-f_L$ $-f_H$) bands. The carrier offset $f_c$ is combined with the normal carrier frequency $f_s$ or $-f_s$ according to TDM1 or TDM2. Then, the final coarse carrier offset $f_{d1}$ or $f_{d2}$ is used in a mixer to shift the passband signal into a baseband signal for TDM1 or TDM2.

The energy estimators 710a, 710b, 710c, 710c, 710d, 710e, 710f play an important role in determining the accuracy of the carrier offset attained in the CCOA 250. The greater the number n of energy estimators, the more accurate is the resulting carrier offset. The illustrated embodiment of the CCOA 250 is designed to achieve a carrier offset to within about 78 kHz. Given that diminished offset, it is then within the capability of the carrier synchronizer 550 of FIG. 5 to handle the fine carrier offset. Hence, the number n is advantageously chosen to result in a carrier offset of at most about 78 kHz in the illustrated embodiment.

Figure 8:
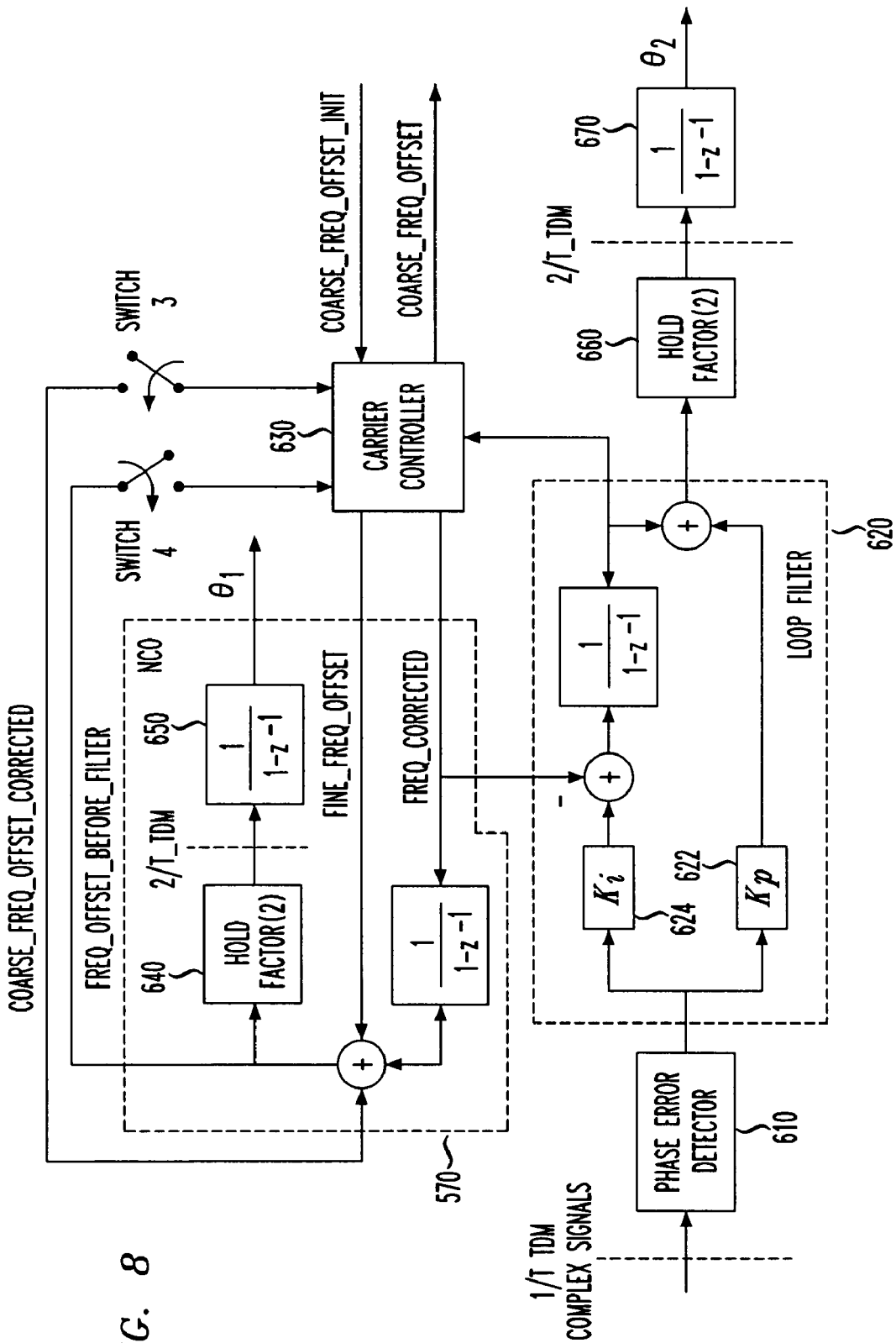
FIG. 8 illustrates a block diagram of an alternative embodiment of a carrier synchronizer contained within the TDM modulator of FIG. 5.
Figure 9:
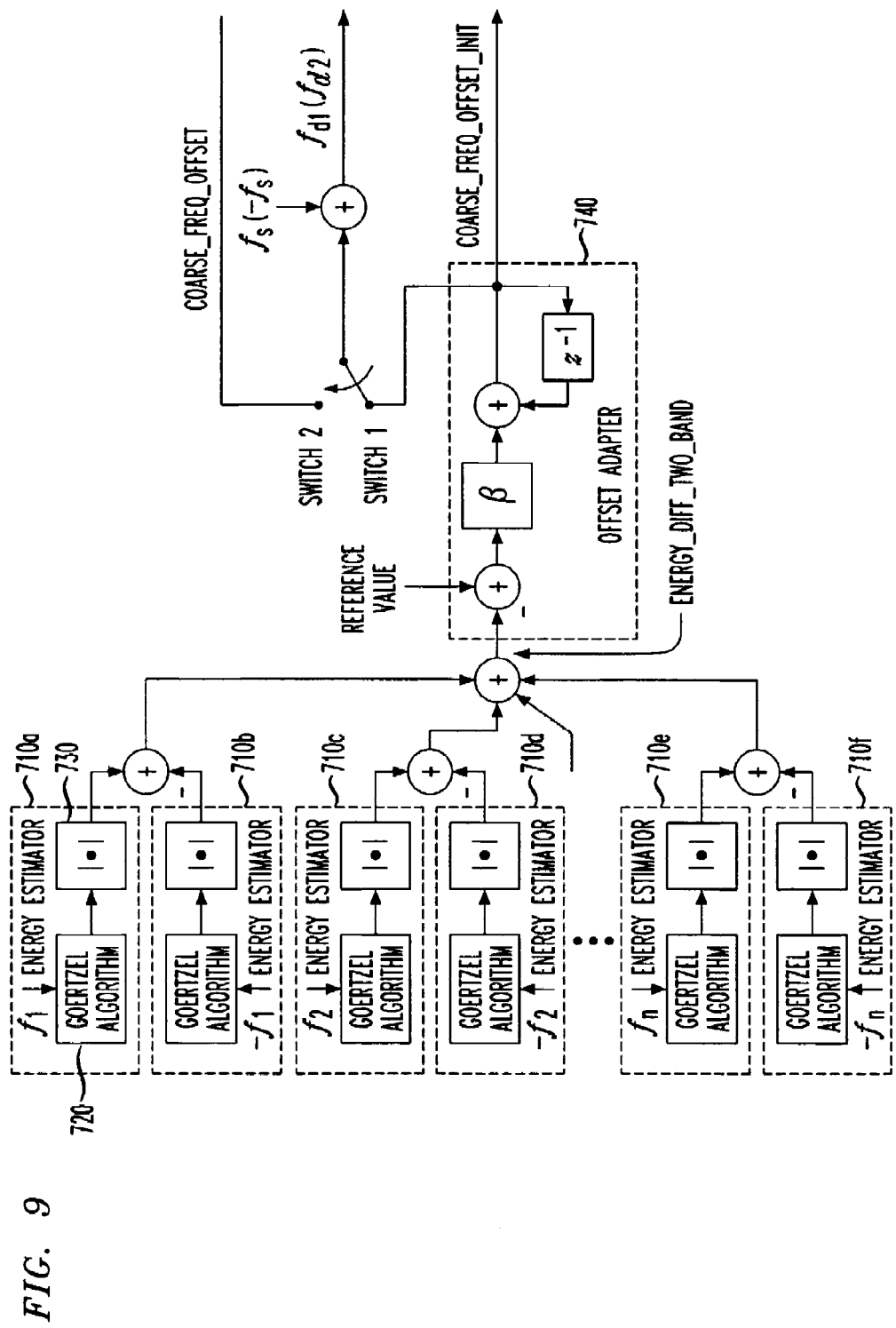
FIG. 9 illustrates a block diagram of an alternative embodiment of a CCOA constructed according to the principles of the present invention.

An alternative technique of carrier recovery for wide carrier offset is shown in FIGS. 8 and 9. In this approach, the CCOA 250 is only employed for an initial evaluation of carrier offset during a training period of the satellite receiver. In the subsequent steady state, a carrier controller 630 that has been modified from that of FIG. 6 manages the coarse carrier offset. The carrier controller 630 continues to move the coarse carrier offset to the CCOA 250 if necessary.

During the training period, switch1 is closed, switch2 is open, and switch3 and switch4 of FIG. 8 are open. During this time, the circuitry shown in FIGS. 8 and 9 operates as before. When the training period is complete and steady state operation is initiated, switch1 is opened, switch2 is closed, and switch3 and switch4 are also closed. The coarse carrier offset, which appears as coarse_freq_offset_init, is used as an initial value for coarse_freq_offset. As time passes, the the carrier controller 630 continually updates the coarse carrier offset based on any Doppler shift occurring between the satellite and the satellite receiver.

In the illustrated embodiment, the carrier controller 630 is responsible for controlling switch1, switch2, switch3 and switch4 during the training period and during subsequent steady state operation. The carrier controller 630 also determines when and what value is to be moved from the carrier offset after the matched filter to the carrier offset before the matched filter or to the CCOA 250 or 255 of FIG. 2.

Figure 10:
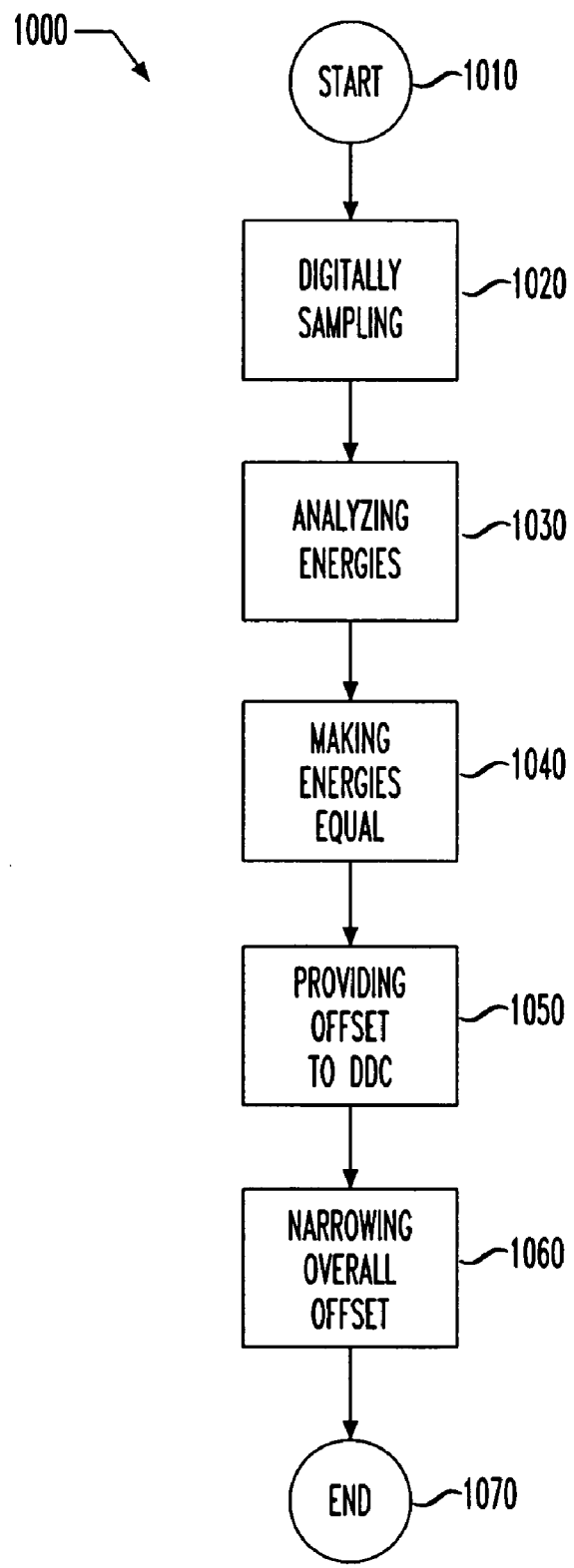
FIG. 10 illustrates a flow diagram of a method of performing coarse carrier offset adjustment carried out according to the principles of the present invention.

Turning now to FIG. 10, illustrated is a flow diagram of a method, generally designated 1000, of performing coarse carrier offset adjustment carried out according to the principles of the present invention. The method 1000 begins in a start step 1010, wherein it is desired to bring a wide carrier offset into a narrower range for subsequent fine carrier offset adjustment (typically by existing SDARS satellite receiver circuitry).

In a step 1020, the received satellite signal is digitally sampled. Then, in a step 1030, energies in the bands on either side of the baseband (as displaced by a coarse carrier offset) are analyzed (perhaps with a Goertzel algorithm as in the illustrated embodiment). Next, in a step 1040, the coarse carrier offset is changed until the energies become substantially equal (perhaps with an LMS algorithm as in the illustrated embodiment).

Then, in a step 1050, the coarse carrier offset is provided to a DDC for application to the received satellite signal. Next, in a step 1060, application of the coarse carrier offset brings any remaining offset of the received satellite signal to within about 78 KHz. The method then ends in an end step 1070.

While the method(s) disclosed herein has(have) been described and shown with reference to particular steps performed in a particular order, those skilled in the pertinent art will understand that these steps may be combined, subdivided, or reordered to form an equivalent method without departing from the teachings of the present invention. Accordingly, unless specifically indicated herein, the order and/or the grouping of the steps are not limitations of the present invention.

Although the present invention has been described in detail, those skilled in the art should understand that they can make various changes, substitutions and alterations herein without departing from the spirit and scope of the invention in its broadest form.

What is claimed is:

1. A coarse carrier offset adapter for determining a coarse carrier offset for application to a received satellite signal, comprising:
    an energy estimator configured to analyze, with respect to said received satellite signal, energies in bands on either side of a baseband as displaced by a coarse carrier offset; and
    an offset adapter coupled to said energy estimator and configured to change said coarse carrier offset until said energies become substantially equal and provide said coarse carrier offset to a digital down converter for said application.

2. The adapter as recited in claim 1 wherein said energy estimator uses a Goertzel algorithm to analyze said energies.

3. The adapter as recited in claim 1 wherein said adapter uses a least means square algorithm to determine said coarse carrier offset.

4. The adapter as recited in claim 1 wherein said energy estimator operates on a digitally sampled form of said received satellite signal.

5. The adapter as recited in claim 1 wherein said received satellite signal is quadrature modulated and said adapter further comprises an energy estimator for both in-phase and quadrature components of said received satellite signal.

6. The adapter as recited in claim 1 wherein said application of said coarse carrier offset brings an offset of said received satellite signal to within about 78 KHz.

7. The adapter as recited in claim 1 wherein said adapter is embodied in a time division multiplexing satellite receiver.

8. A time division multiplexing (TDM) satellite receiver, comprising:
    a TDM antenna adapted to receive a quadrature modulated satellite signal;
    an antenna radio frequency (RF) processor coupled to said TDM antenna;
    an RF/intermediate frequency (RF/JF) processor coupled to said antenna radio frequency processor;
    an analog to digital converter (ADC) coupled to said RE/IF processor;
    first and second TDM demodulators; and
    a digital down converter, interposing said ADC and said first and second TDM demodulators and having a coarse carrier offset adapter for determining a coarse carrier offset for application to said satellite signal, including:
        an energy estimator configured to analyze, with respect to said satellite signal, energies in bands on either side of a baseband as displaced by a coarse carrier offset, and
        an offset adapter coupled to said energy estimator and configured to change said coarse carrier offset until said energies become substantially equal and provide said coarse carrier offset to said digital down converter for said application.

9. The satellite receiver as recited in claim 8 wherein said energy estimator uses a Goertzel algorithm to analyze said energies.

10. The satellite receiver as recited in claim 8 wherein said adapter uses a least means square algorithm to determine said coarse carrier offset.

11. The satellite receiver as recited in claim 8 wherein said adapter further includes an energy estimator for both in-phase and quadrature components of said satellite signal.

12. The satellite receiver as recited in claim 8 wherein said application of said coarse carrier offset brings an offset of said satellite signal to within about 78 KHz.

13. The satellite receiver as recited in claim 8 wherein an initial carrier offset of said satellite signal is as much as 1.4 MHz.

* * * * *